United States Patent
Huang et al.

(10) Patent No.: US 7,952,845 B2
(45) Date of Patent: May 31, 2011

(54) V-BAND RADIO FREQUENCY ELECTROSTATIC DISCHARGE PROTECTION CIRCUIT

(75) Inventors: Bo-Jr Huang, Taipei (TW); Huei Wang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/611,300

(22) Filed: Nov. 3, 2009

(65) Prior Publication Data
US 2010/0277840 A1   Nov. 4, 2010

(30) Foreign Application Priority Data
May 4, 2009   (TW) .............................. 98114726 A

(51) Int. Cl.
*H02H 9/00*   (2006.01)
(52) U.S. Cl. ......................................... 361/56
(58) Field of Classification Search ..................... 361/56
See application file for complete search history.

(56) References Cited

U.S. PATENT DOCUMENTS

| | | | |
|---|---|---|---|
| 7,265,433 B2 * | 9/2007 | Pillai et al. | 257/531 |
| 2005/0264966 A1 * | 12/2005 | Ker et al. | 361/56 |
| 2006/0151851 A1 * | 7/2006 | Pillai et al. | 257/531 |
| 2009/0195946 A1 * | 8/2009 | Kleveland | 361/56 |
| 2010/0277840 A1 * | 11/2010 | Huang et al. | 361/56 |

OTHER PUBLICATIONS

Bo-Jr Huang, et al., "Design and Analysis for a 60-GHz Low-Noise Amplifier With RF ESD Protection", IEEE Trans. on Microwave Theory and Techniques, vol. 57, No. 2, Feb. 2009, pp. 298-305.

* cited by examiner

*Primary Examiner* — Ronald W Leja

(57) ABSTRACT

A V-band radio frequency (RF) electrostatic discharge (ESD) protection circuit uses meander inductors and diodes connecting in series to provide ESD protection. When operated in low frequency, the static electricity input from a RF pad may discharge to ground or to a voltage VDD through the meander inductor and the diode, so that a core circuit is not damaged by ESD. When operated in high frequency, the high frequency stray effect of the core circuit is substantially reduced due to impedance isolation generated by the meander inductors. Therefore, a low-noised amplifier (LNA) can receive an accurate high frequency input signal.

6 Claims, 2 Drawing Sheets

V-BAND RADIO FREQUENCY ELECTROSTATIC DISCHARGE PROTECTION CIRCUIT

BACKGROUND OF THE INVENTION

1. Field of the Invention

The present invention relates to a radio frequency (RF) electrostatic discharge (ESD) protection circuit, especially to a V-band (50-75 GHz) RF ESD protection circuit which uses a meander inductor and an ESD member connecting in series for protecting a core circuit from ESD.

2. The Prior Arts

In a communication system or a sub-circuit of the communication system, such as a low-noise amplifier (LNA), the input port thereof directly contacts with external environment through an antenna. Thus, the circuit is likely to be damaged by static electricity due to environment, weather, or human factors. At the present day, the technology to protect the system at a direct current bias port from electrostatic damage is pretty mature. However, an electrostatic protection circuit to protect the system will generate a stray effect. The electrostatic protection at an RF input port or an RF output port is still a challenge due to the stray effect of the electrostatic protection circuit itself.

As communication systems progress, electronic products with high data transmission rates have been developed and therefore the operation frequencies also increase. When operated in high frequency, the stray effect of the conventional electrostatic protection circuit will seriously degrade the performance of a core circuit. Although various RF electrostatic protection designs are disclosed to minimize the performance degradation of the core circuits caused by the protection circuits, the designs in the millimeter wave range still pose many problems.

SUMMARY OF THE INVENTION

A primary objective of the present invention is to provide a V-band radio frequency (RF) electrostatic discharge (ESD) protection circuit that provides ESD protection and prevents a core circuit from performance degradation under a high operation frequency.

To achieve the objective, a V-band RF ESD protection circuit according to the present invention includes at least one first meander inductor, at least one second meander inductor, at least one first ESD member and at least one second ESD member. The first inductor and the second inductor are respectively formed in top two metal layers, and are electrically connected with an RF pad. The first inductor connects with the first ESD member in series and the second inductor connects with the second ESD member in series for enhancing the discharge of static electricity along discharge paths. An anode of the first ESD member connects to ground, and a voltage is applied to a cathode of the second ESD member.

When operated in low frequency, the static electricity may be discharged to ground through the first meander inductor and the first ESD member, or discharged to voltage VDD through the second meander inductor and the second ESD member. When operated in high frequency, the impedance isolation generated by the first meander inductor and the second meander inductor substantially reduces the high frequency stray effect of the core circuit.

Therefore, the present invention overcomes the aforementioned disadvantages of prior art. The V-band RF ESD protection circuit according to the present invention uses the first ESD member, the first meander inductor, the second meander inductor and the second ESD member connecting in series to provide ESD protection and prevent the core circuit from performance degradation under a high operation frequency.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
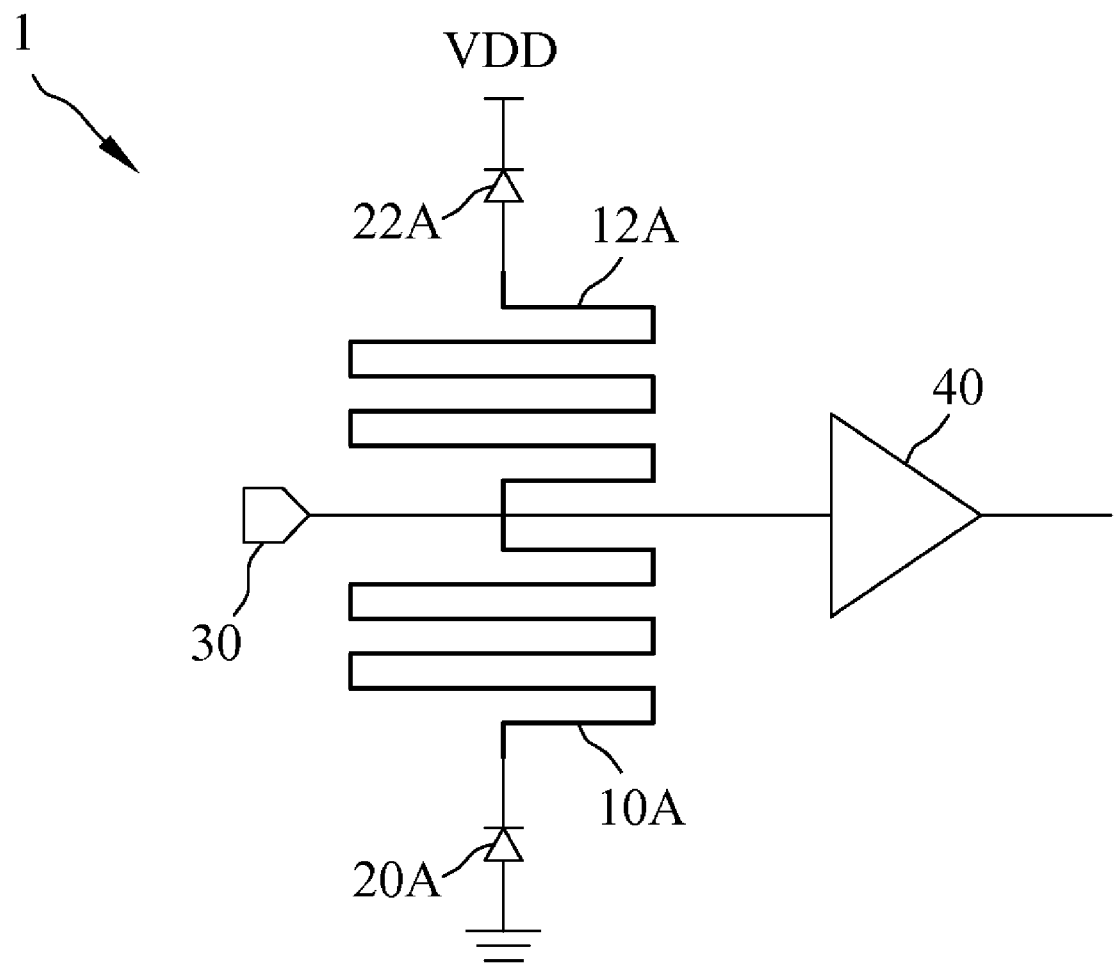
FIG. 1 is a schematic view showing a V-band RF ESD protection circuit according to the present invention.

Referring to FIG. 1, a V-band radio frequency (RF) electrostatic discharge (ESD) protection circuit 1 according to an embodiment of the present invention includes at least one first meander inductor 10A, at least one second meander inductor 12A, at least one first ESD member 20A and at least one second ESD member 22A.

A first terminal of the first meander inductor 10A is connected to a cathode of the first ESD member 20A in series. A first terminal of the second meander inductor 12A is connected to an anode of the second ESD member 22A is series. A second terminal of the first meander inductor 10A and a second terminal of the second meander inductor 12A are connected to an RF pad 30 in parallel. The RF pad 30 is connected to a low-noise amplifier (LNA) 40. The LNA 40 generates a low-noise amplified signal and transmits the low-noise amplified signal to a core circuit (not shown in figures). An anode of the first ESD member 20A is grounded, and a voltage VDD is applied to a cathode of the second ESD member 22A.

If the V-band RF ESD protection circuit 1 includes more than one set of the first meander inductor 10A, the second meander inductor 12A, the first ESD member 20A and the second ESD member 22A, the connection of another set of the first meander inductor 10A, the second meander inductor 12A, the first ESD member 20A and the second ESD member 22A is similar to that shown in FIG. 1.

Static electricity is input from the RF pad 30. When operated in low frequency, the static electricity is discharged to ground through the first meander inductor 10A and the first ESD members 20A, or discharged to the voltage VDD through the second meander inductors 12A and the second ESD members 22A, thereby protecting the core circuit from ESD. When operated in high frequency, the first meander inductors 10A and the second meander inductors 12A provide the impedance isolation to substantially reduce the high frequency stray effect, so that the LNA 40 can receive an accurate high frequency input signal.

The LNA 40 may also be a power amplifier or a frequency mixer. The first ESD member 20A and the second ESD member 22A may be diodes.

Figure 2:
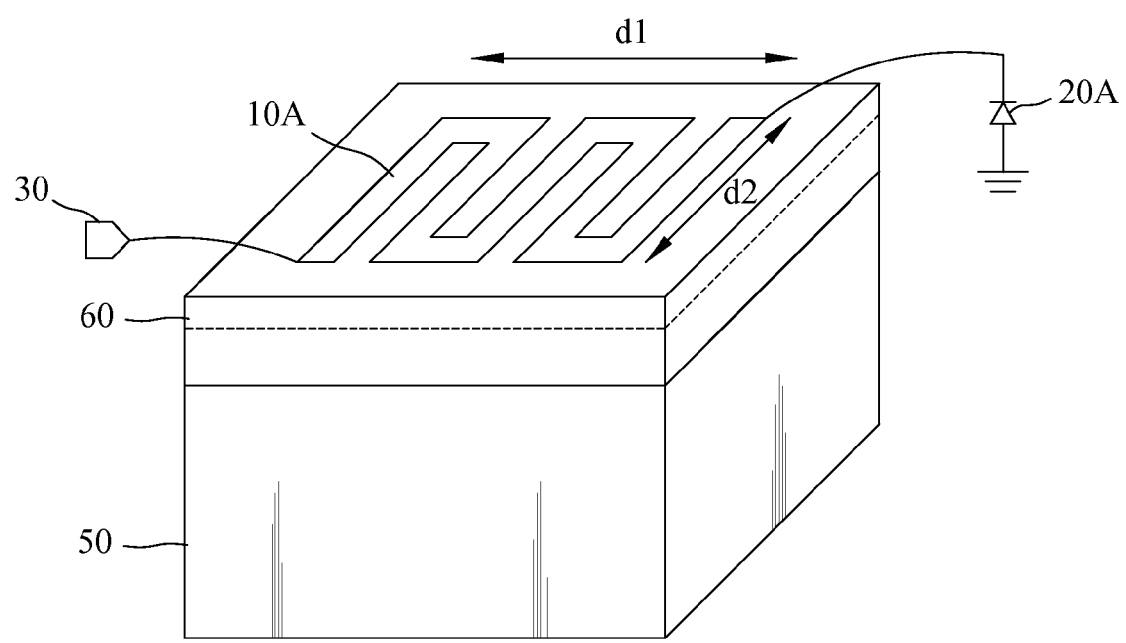
FIG. 2 is a perspective view showing the V-band RF ESD protection circuit according to the present invention.

FIG. 2 is a perspective view showing the V-band RF ESD protection circuit 1. The first meander inductor 10A and the second meander inductor 12A (not shown) are disposed in two metal layers 60, respectively. The two metal layers 60 are located at a top of the substrate 50. Each of the first meander inductor 10A and the second meander inductor 12A has a width d1 and a length d2. The width d1 is about 120-140 μm, and the length d2 is about 150-170 μm.

Since the first meander inductor 10A itself is not grounded, it is unnecessary to connect the first meander inductor 10A with a grounding metal layer (not shown in figures). Therefore, the parasitic capacitance between the first meander inductor 10A, the second meander inductor 12A and the grounding metal layer are reduced. The first meander inductor 10A and the second meander inductor 12A thus become wideband inductors. As a result, the whole V-band RF ESD protection circuit 1, from the RF pad 30 to the core circuit, may form a low-loss wideband band-pass filter.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A V-band radio frequency (RF) electrostatic discharge (ESD) protection circuit adapted for discharging static electricity input from a RF pad, the V-band RF ESD protection circuit comprising:
    at least one first meander inductor;
    at least one second meander inductor;
    at least one first ESD member; and
    at least one second ESD member;
    wherein the first meander inductor and the second meander inductor are respectively disposed in two metal layers that are located at a top of a substrate, a first terminal of the first meander inductor is connected with a cathode of the corresponding first ESD member in series, a first terminal of the second meander inductor is connected with an anode of the corresponding second ESD member in series, a second terminal of the first meander inductor and a second terminal of the corresponding second meander inductor are connected to the RF pad in parallel, the RF pad is connected to a low-noise amplifier, the low-noise amplifier generates a low-noise amplified signal and transmits the low-noise amplified signal to a core circuit, an anode of the first ESD member is grounded, and a voltage is applied to a cathode of the second ESD member.

2. The protection circuit of claim 1, wherein each of the first meander inductor and the second meander inductor has a width in a range from 120 to 140 μm and a length in a range from 150 to 170 μm.

3. The protection circuit as claimed in claim 1, wherein the low-noise amplifier is a power amplifier.

4. The protection circuit as claimed in claim 1, wherein the low-noise amplifier is a frequency mixer.

5. The protection circuit as claimed in claim 1, wherein the first ESD member is a diode.

6. The protection circuit as claimed in claim 1, wherein the second ESD member is a diode.

* * * * *